United States Patent [19]

Oehlert et al.

[11] Patent Number: 4,595,249
[45] Date of Patent: Jun. 17, 1986

[54] RECEPTACLE FOR ELECTRONIC CARDS AND METHOD OF ASSEMBLING THE SAME

[75] Inventors: Yves Oehlert, Rueil; Jean Neyroud, Domene; Jean Joly, Houilles, all of France

[73] Assignee: La Telemecanique Electrique, Nanterre, France

[21] Appl. No.: 689,041

[22] PCT Filed: Apr. 11, 1984

[86] PCT No.: PCT/FR84/00101
§ 371 Date: Dec. 6, 1984
§ 102(e) Date: Dec. 6, 1984

[87] PCT Pub. No.: WO84/04224
PCT Pub. Date: Oct. 25, 1984

[30] Foreign Application Priority Data

Apr. 15, 1983 [FR] France ................................ 83 06174

[51] Int. Cl.⁴ ............................................. H05K 1/14
[52] U.S. Cl. ................................. 339/17 LM; 211/41
[58] Field of Search ............. 339/17 LM, 17 M, 64 M, 339/65 R, 66 M; 361/413, 415; 211/41

[56] References Cited

U.S. PATENT DOCUMENTS

| | | | |
|---|---|---|---|
| 3,733,523 | 5/1973 | Reynolds et al. | 211/41 |
| 3,838,777 | 10/1974 | Thornicroft et al. | 211/41 |
| 3,895,719 | 7/1975 | Cakora | 361/415 |
| 4,046,443 | 9/1977 | Champagne | 339/66 M |
| 4,096,546 | 6/1978 | Gabr | 361/415 |
| 4,407,416 | 10/1983 | Anderson | 361/415 |

FOREIGN PATENT DOCUMENTS

| | | |
|---|---|---|
| 0018191 | 10/1980 | European Pat. Off. . |
| 0067757 | 12/1982 | European Pat. Off. . |
| 2119709 | 11/1972 | Fed. Rep. of Germany . |
| 2411438 | 7/1979 | France . |
| 2430164 | 1/1980 | France . |

Primary Examiner—Neil Abrams
Attorney, Agent, or Firm—Young & Thompson

[57] ABSTRACT

A container (1) for an auto-control possesses a bottom (2) carrying a printed circuit (3), to which connecting blocks (8) are fastened. The bottom (2) extends between two flank walls (34). The other two walls of the container (1) are latticed and consist of slides (11) intended for guiding the input/output cards towards the blocks (8). The bottom (2) also incorporates an inner wall (13) interposed between the circuit (3) and the interior of the container. The blocks (8) are laid against the periphery of apertures (14) and are accessible via these from the interior of the container (1). Each slide (11) carries a stud (31) engaged in a perforation (24) in one of the blocks (8). Adjacent the wall (13), the slides (11) have a certain play (J) between them. At their other end, they abut against one another. The invention is used to allow the slides to follow, for example, movements of thermal origin experienced by the circuit (3), without however fastening the slides to the latter.

20 Claims, 19 Drawing Figures

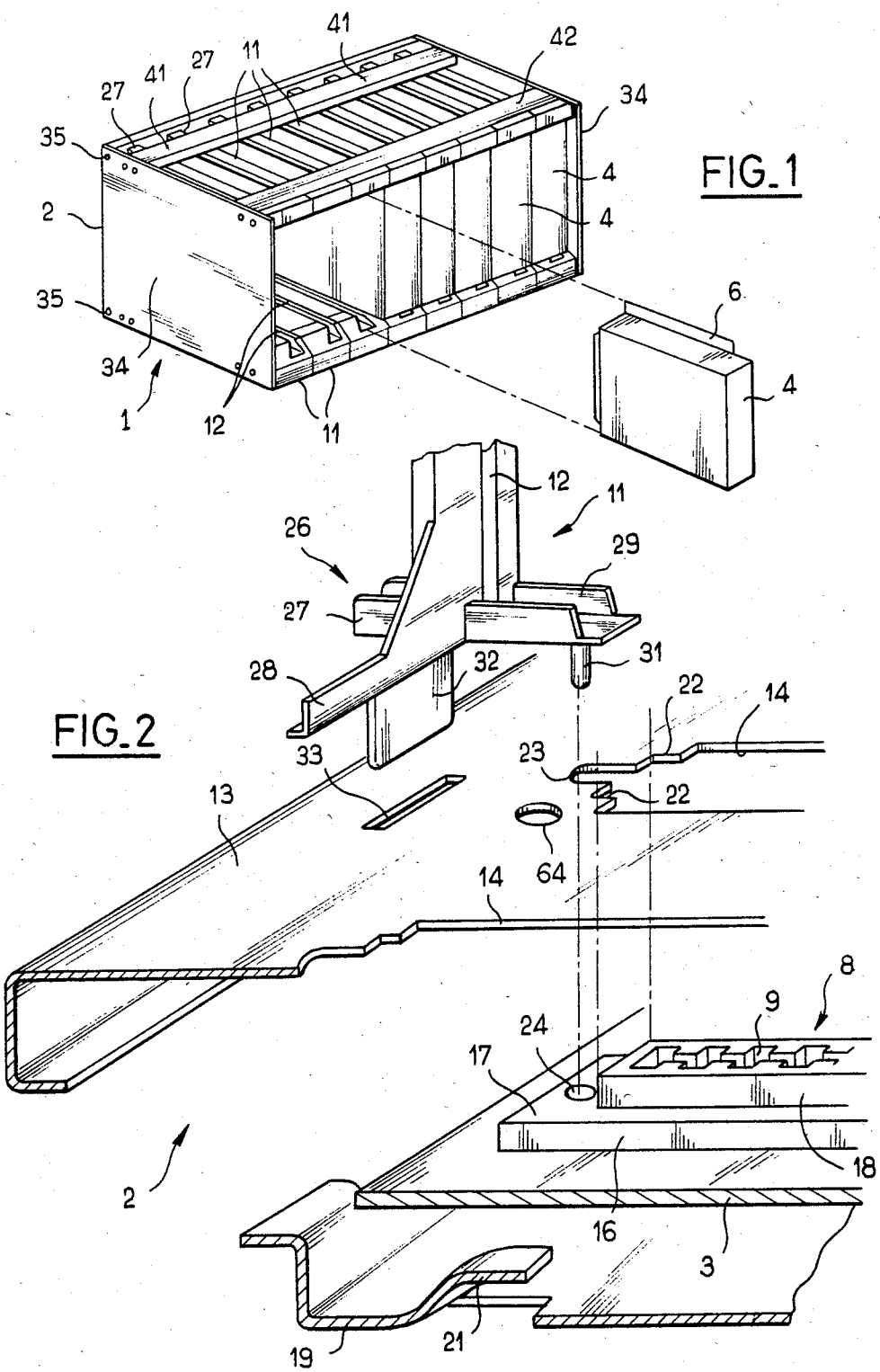

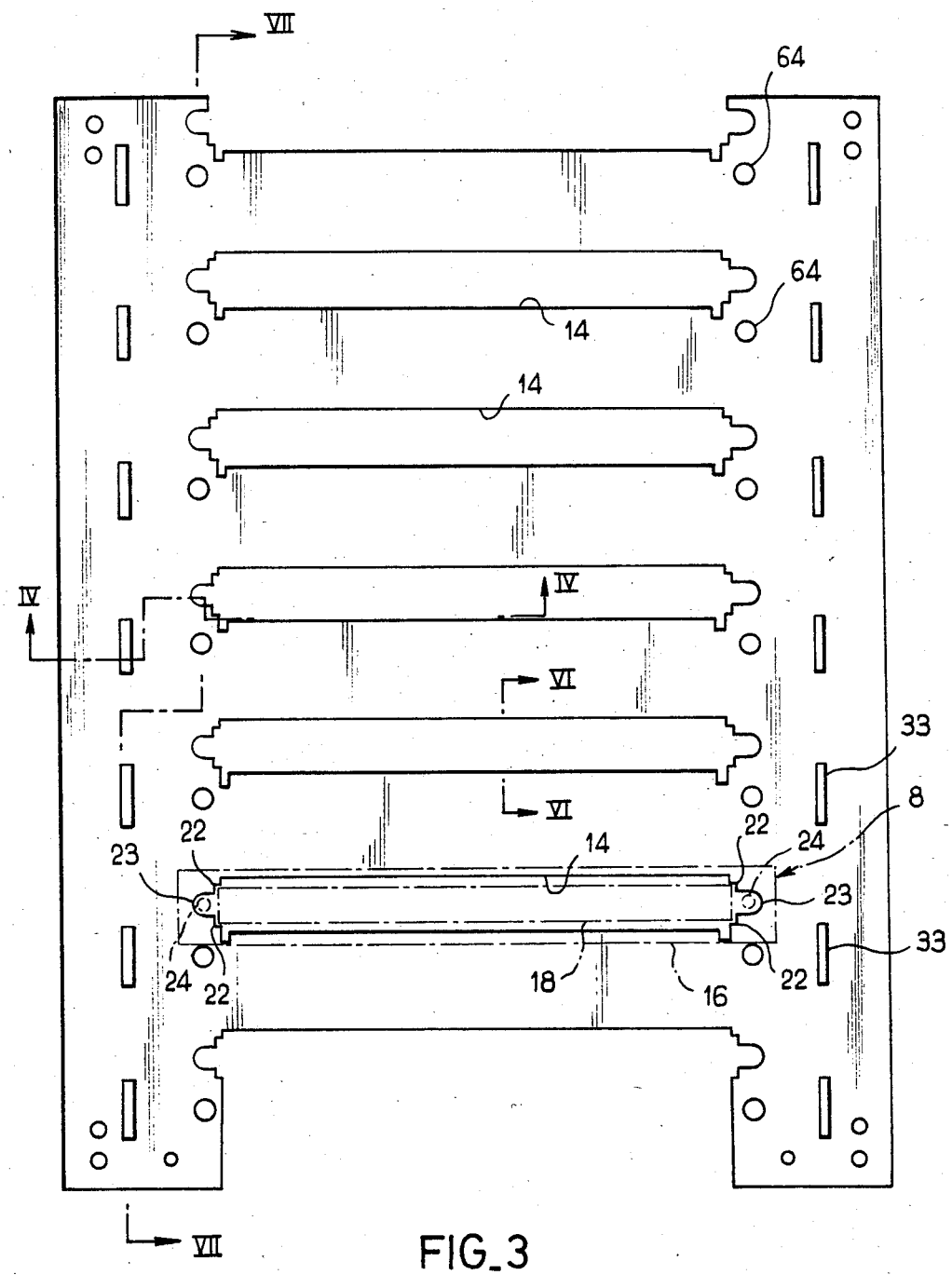
FIG_3

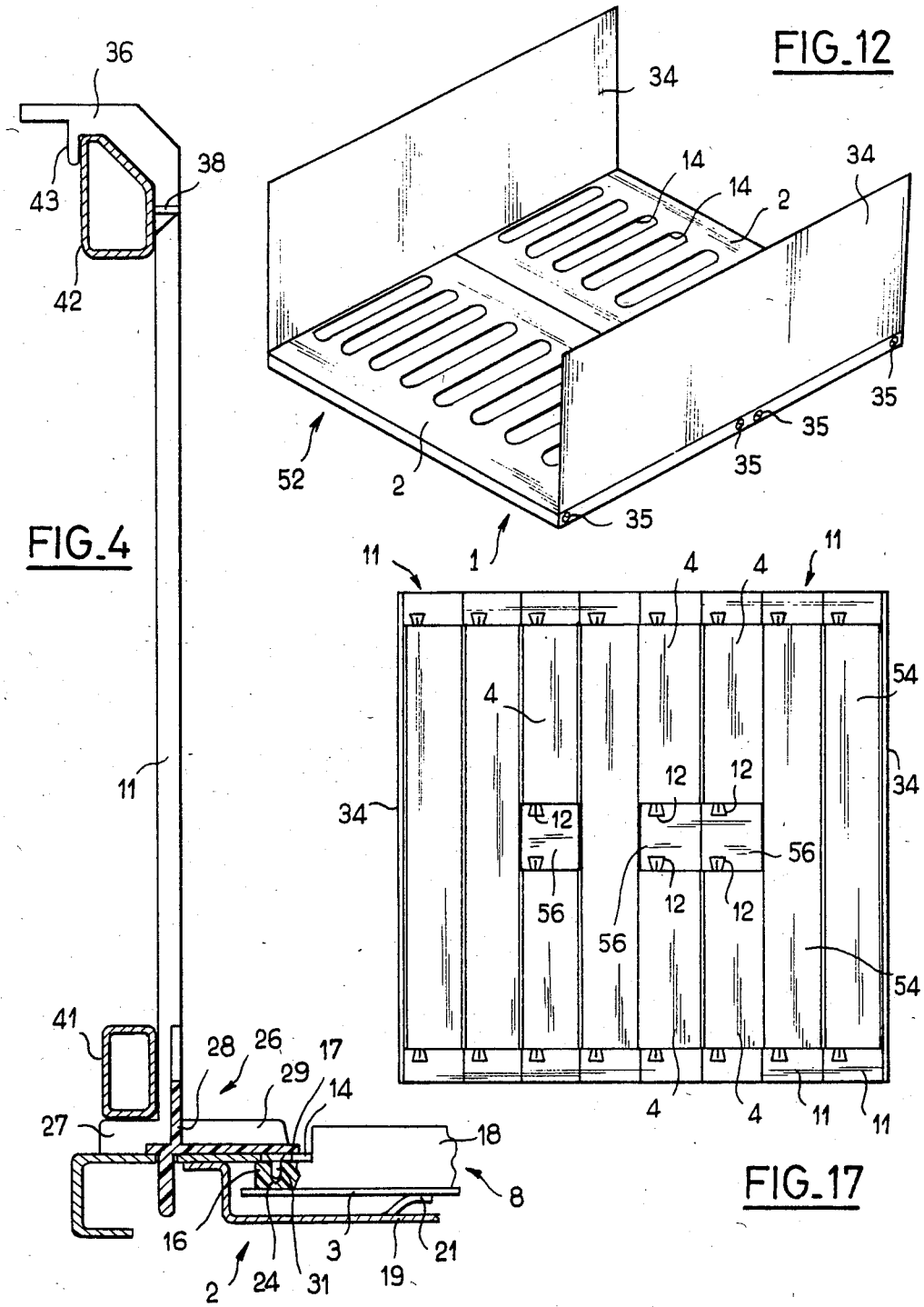

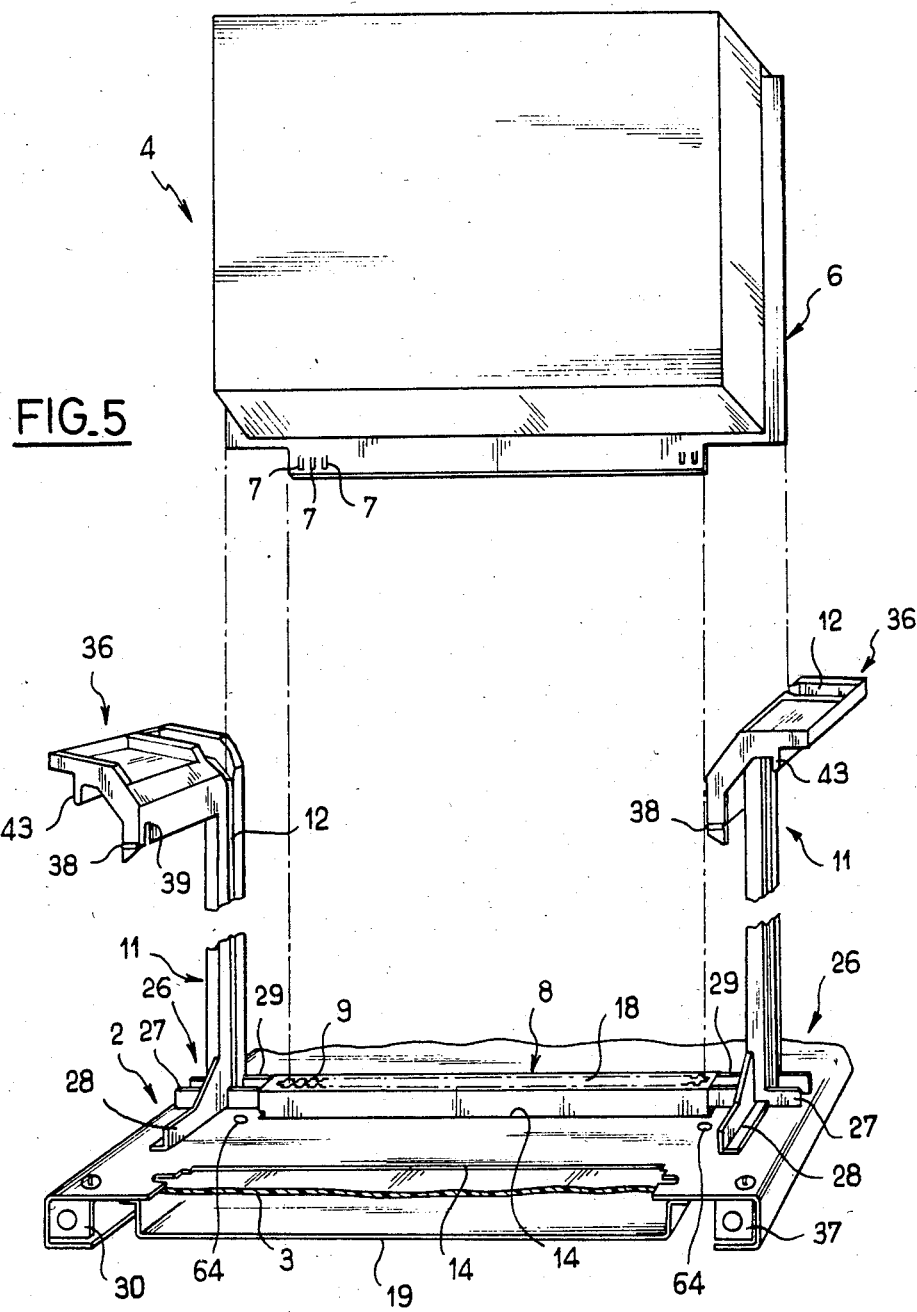

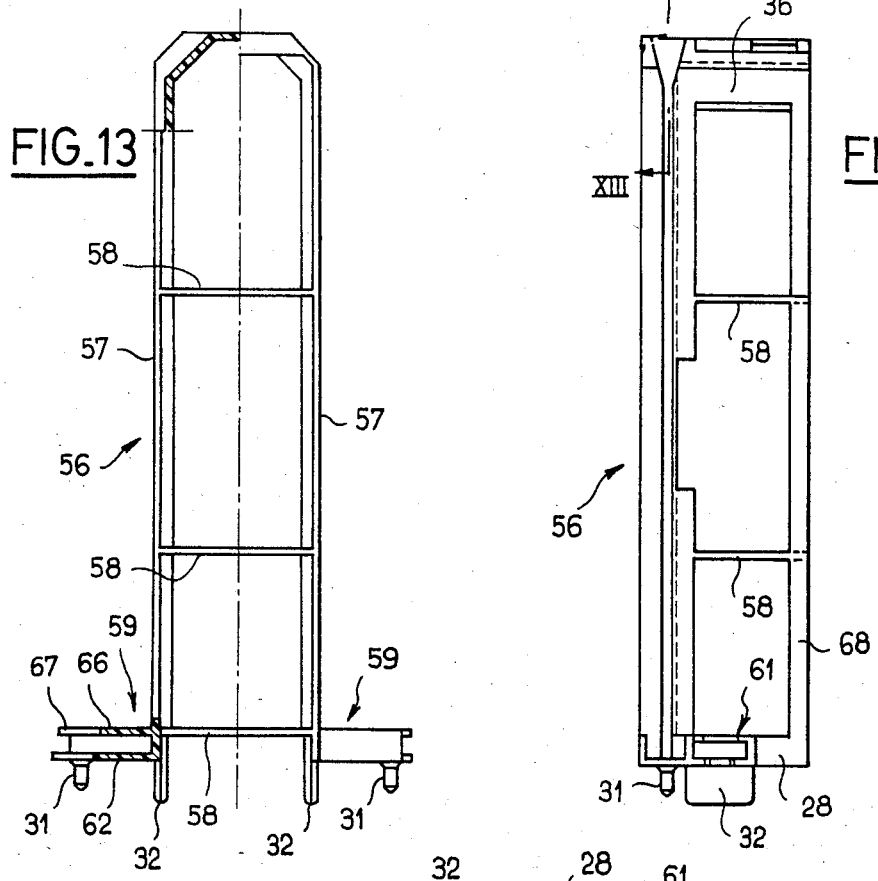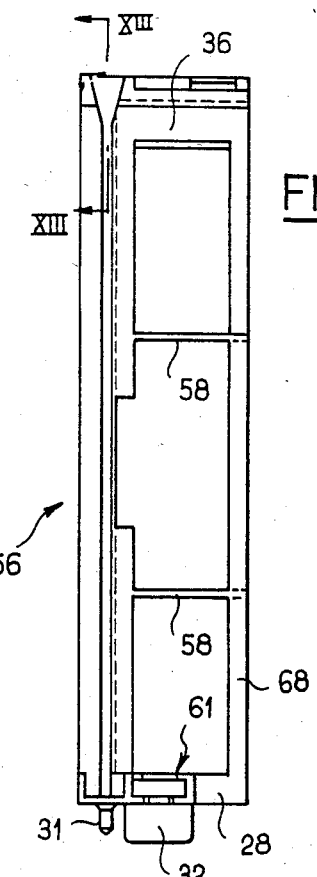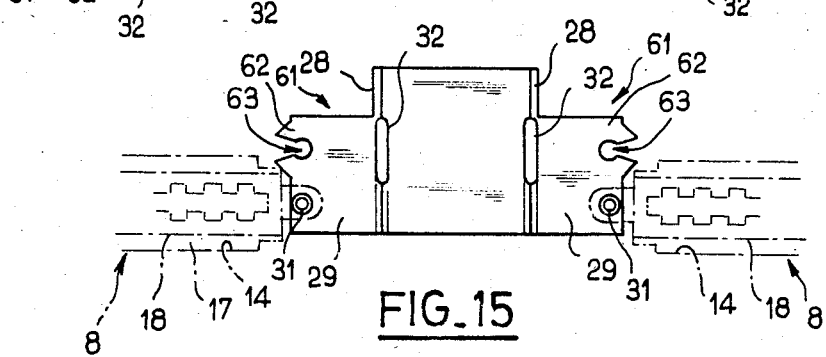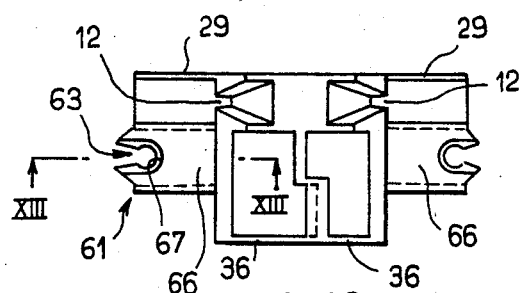

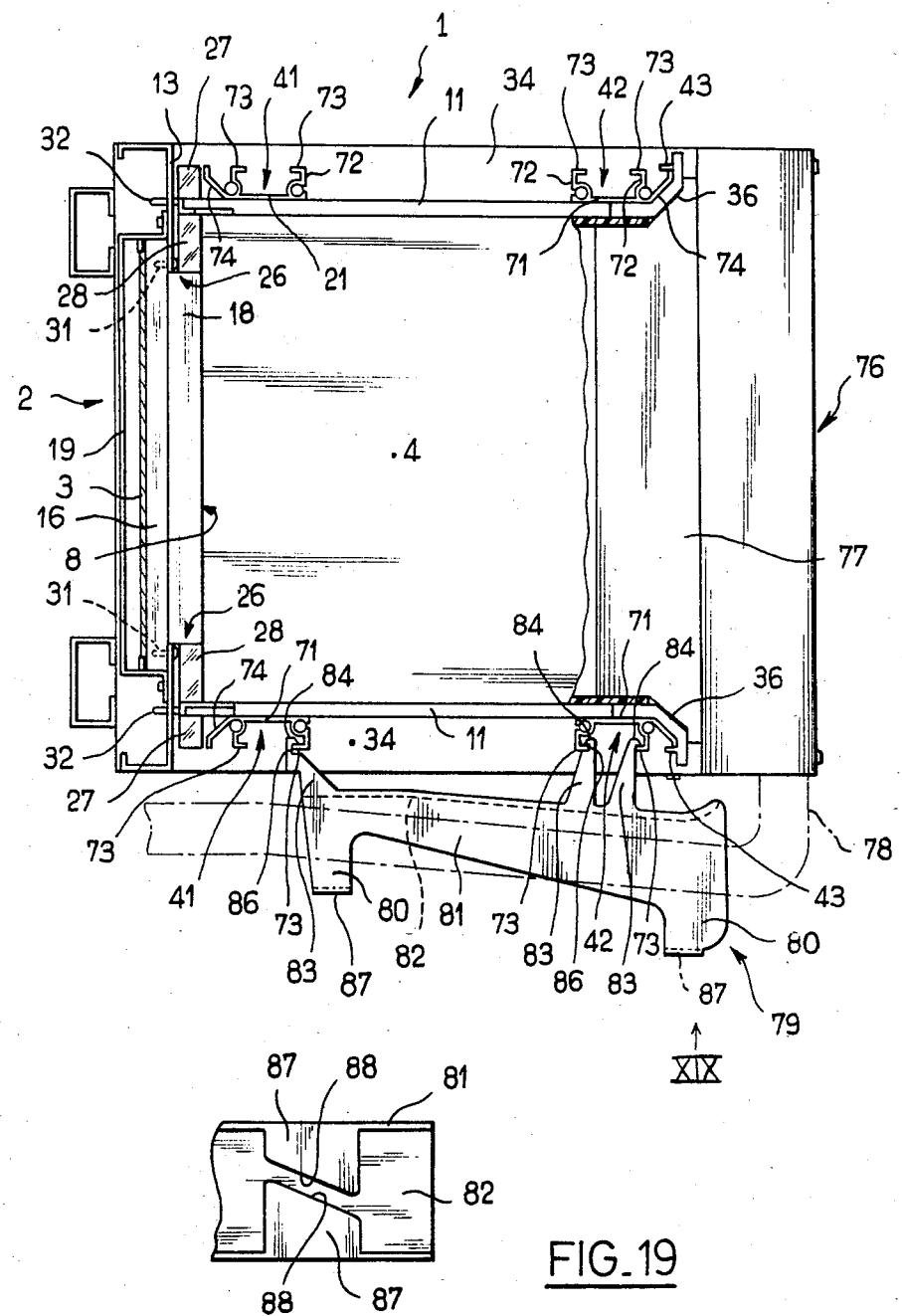

RECEPTACLE FOR ELECTRONIC CARDS AND METHOD OF ASSEMBLING THE SAME

The present invention relates to a receptacle for electronic cards.

The present invention also relates to a method of assembling the same.

Apparatuses of the programmable auto-control type usually incorporate, in practice, a container of which the bottom (often arranged vertically during operation) carries a printed circuit, used as a bus, and rows of connections, each of which is intended for connecting the printed circuit to corresponding pins arranged at the edge of an input card or an output card. The input cards and output cards, which will be called input/output cards hereafter, are placed side by side in the container. Each card also carries, on a side thereof remote from the bottom of the container, other connections by means of which it is connected to devices to be monitored, where an input card is concerned, or to devices to be controlled, where an output card is concerned.

It is known to make the rows of connections in blocks which are fastened to the bottom of the container and then connect the connections electrically to the printed circuit by means of brazed seams.

However, the material of the container bottom, for example metal, and that of the printed circuit have very different coefficients of thermal expansion. Since the printed circuit is connected to the container bottom opposite each row of connections, movements of thermal origin risk causing bending in the printed circuit, and this can damage and/or impose a strain on it, and even fracture the brazed seams between this printed circuit and the connections.

It is also known to produce as a container a frame formed by two opposing flanks connected to one another by means of two pairs of profiled crossmembers. Each pair of crossmembers forms one of the sides of the frame. Slides or card guides directed perpendicularly to the crossmembers and to the container bottom are mounted next to one another against the face of each pair of crossmembers which is directed towards the interior of the container. The slides make it possible to slidably insert an input/output card between two opposing slides, each of which is carried by one of the pairs of crossmembers. The rows of connections are fastened to the printed circuit, which is fastened by means of screwing or snapping-in to one of the ends of at least some of the slides.

In this embodiment, there is no longer any risk that the electrical connections made between the rows of connections and the printed circuit will be subjected to mechanical stress, since the block carrying each row of connections is connected mechanically to the substrate of the printed circuit. However, the printed circuit risks being subjected to bending stress if it experiences movements of thermal origin which the ends of the slides cannot follow because of their method of assembly. Moreover, the printed circuit mounted in this way is not protected on either side and is therefore widely exposed to shocks, dust and other attacks.

The object of the invention is, therefore, to overcome these disadvantages by proposing an arrangement of a programmable auto-control, in which the printed circuit and its connection to the rows of connections are protected from mechanical attacks, particularly from stresses attributed to differential thermal movements.

The invention is therefore directed to a container the bottom of which possesses at least one printed circuit, on which connecting blocks, each carrying a row of connections, are fastened towards the interior of the container, slides aligned side by side along two opposite walls adjacent to the bottom of the container, one end of each slide being associated mechanically with the container bottom, means of positioning the said end of each slide as regards displacement parallel to the rows of connections and as regards displacement transverse to the bottom of the container, and input/output cards which are each mounted removably side by side between two opposing slides, the cards having on one of their edges pins adapted to cooperate with the connecting blocks so as to connect the cards electrically to the printed circuit.

According to the invention, the container is characterized by comprising means of guiding the printed circuit in its plane relative to the container bottom, and means of coupling, as to translation transverse to the rows of connections, the end of each slide and the printed circuit in the vicinity of the associated connecting block, and wherein, at least in the vicinity of the container bottom, the adjacent slides have a certain play between them and are mounted to be laterally displaceable relative to one another.

If the printed circuit is subject to movements of a thermal nature, it has the possibility of being displaced in its plane relative to the container bottom. In the distinctly more dangerous case where the movement is transverse to the rows of connections, the printed circuit carries the slides along with it by means of the coupling means. Because of their play in this direction, the slides can follow the movement determined by the printed circuit. The invention thus eliminates bending of thermal origin in the printed circuit and in the various junctions of the assembly.

According to a second aspect of the invention, the method of assembling such a container is characterized by making a U-shaped framework comprising an inner wall of the container bottom and two flanks adjacent to two opposite edges of the bottom, which edges will be parallel to the rows of connections during operation, associating the printed circuit with the inner wall of the container bottom, mounting the slides in such a way that they form two other opposite walls of the container, each extending between the two flanks, for this purpose bringing a foot of each slide in a substantially stable abutment against the inner wall, arranging at least one crossmember on the outside of each of the walls formed by the slides, this crossmember being fastened to the two flanks and interacting with means carried by the slides to maintain the latter counter to any displacement in a direction transverse to the container bottom, and slidingly inserting each input/output card between two opposing slides and plugging each card into at least one of the rows of connections.

Other particular features and advantages of the invention will also emerge from the following description.

In the attached drawings given by way of non-limiting example:

FIG. 1 is a perspective view of a container according to the invention during the installation of the input/output cards;

FIG. 2 is a partial exploded perspective view of the bottom of the container of FIG. 1 and of a slide;

FIG. 3 is a plan view of the inner wall of the container bottom;

FIG. 4 is a partial view of the bottom of the container equipped with card-guide slides in a section along a plane such as IV—IV of FIG. 3;

FIG. 5 is a partial perspective view of the bottom carrying two opposing slides and of a card-carrying housing intended to be installed between these two slides;

FIG. 12 is a view similar to FIG. 9, but relating to a double container;

FIG. 13 is a view in side elevation of a double slide, with a partial section through the foot along the plane XIII—XIII of FIG. 16 and a partial section through the top of one of the slides along the plane XIII—XIII of FIG. 14;

FIG. 14 is a front view of the double slide of FIG. 13;

FIGS. 15 and 16 are respectively bottom and top views of the slide of FIGS. 13 and 14;

FIG. 17 is a front view of a programmable auto-control with a double container;

FIG. 18 is a view of an alternative embodiment of the auto-control container in a section along a parting plane between two housings; and FIG. 19 is a partial view of the wire guide according to the arrow XIX in FIG. 18.

Figure 6:
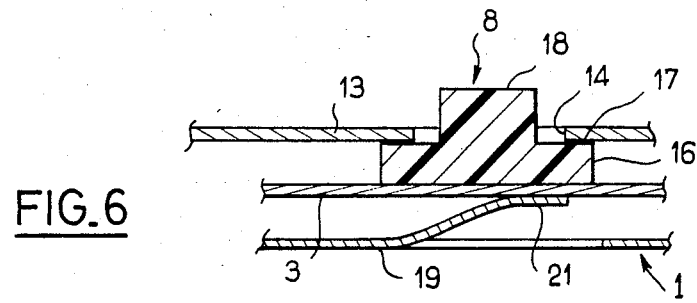
FIG. 6 is a partial view of the bottom in a section along a plane such as VI—VI of FIG. 3, the row of connections being represented diagrammatically there by a solid block.

As shown in FIG. 1, a programmable auto-control, taken as an example of a modular apparatus for the acquisition, processing and restitution of digital signals, comprises a container 1, of which the bottom 2 arranged vertically incorporates a printed circuit 3 (FIG. 2). The auto-control also incorporates housings 4 (FIG. 1) which are placed vertically side by side in the container 1. Each housing 4 comprises two half-housings (not shown) which are snapped together or screwed to one another, with, interposed between them, an input-/output card 6 which projects on the rear face of the housing 4 and which carries at this location male pins 7 (FIG. 5) intended for plugging into a female connecting block 8, which has an orifice 9 capable of receiving the edge of the card 6 provided with the pins 7 and which contains a row of female connections connected to the printed circuit 3. The blocks 8 are fastened parallel to one another to the face of the printed circuit 3 turned towards the interior of the container 1, each block being located opposite one of the locations for the housings 4.

As shown in FIGS. 1 and 5, each card 6 also projects laterally on either side of the housing 4, so as to be during operation, removably inserted in the slots 12 of two slides 11 located opposite one another in the container 1. The slides 11 are mounted along two opposite side walls of the container 1 which are adjacent to the bottom 2.

In the drawings, the housings 4 have been shown in a very simplified way, particularly their face remote from the bottom 2 of the container 1. In fact, this face is arranged, in a way not shown, to receive, during operation, a terminal-box (also not shown) intended for connecting the card 6 to the devices to be monitored, where an input card is concerned, or the devices to be controlled, where an output card is concerned.

According to the invention, the arrangement has an inner wall 13 made of galvanized sheet-iron (FIGS. 2 to 6) which is interposed between the printed circuit 3 and the interior of the container 1. The inner wall 13 is plane, with the exception of its two longitudinal edges (adjacent to the slides 11) which are curved outwards in the form of a U. The inner wall possesses a series of elongate apertures 14, each of which is opposite one of the connecting blocks 8.

As shown more particularly in FIG. 2, the connecting block 8 has a base 16 adjacent to the circuit 3, the block subsequently being narrowed by means of a shoulder 17 forming the upper face of the base 16 and surrounding a rectangular boss 18, in which the orifice 9 containing the connections is made.

As shown by dot-and-dash lines in FIG. 3, each aperture 14 is smaller than the base 16 of the blocks 8, but is larger than the boss 18, so that the bosses 18 project on the inside of the container 1 (FIG. 5), whilst the bases 16 remain on the other side of the inner wall 13.

The bottom of the container 1 also incorporates a screening cover 19 (FIG. 2) which is fastened to the wall 13 by means of screwing and which covers and protects the circuit on the side opposite the wall 13.

The arrangement also possesses means of urging the circuit 3 towards the wall 13, whereby the shoulders 17 acting as a stop abut against wall 13 around the apertures 14. Thus, the circuit 3 is guided in its plane relative to the wall 13 within the limit of the movement which the bosses 18 are allowed in the apertures 14.

In the example illustrated, these means consist of tongues the cover 19 towards the interior of the container, these tongues comprising elastic tabs 21 pressed against the circuit 3 (FIGS. 4 and 6).

As shown in FIG. 3, the apertures 14 have a rectangular contour, only the four corners 22 of which have been retained. The rectangle defined in this way by the four corners 22 is longer and wider than the rectangle of the boss 18. The longitudinal play is calculated to allow possible longitudinal expansion of the blocks, whilst at the same time ensuring reasonably accurate positioning of the printed circuit 3 relative to the inner wall 13 in the longitudinal direction of the rows of connections. It is solely the apertures 14 interacting with the bosses 13 which ensure a certain initial positioning of the circuit 3 relative to the wall 13.

Furthermore, the boss 18 has an appreciable lateral play between the four corners 22.

As will be seen below, the purpose of this play is to allow the boss 18 to be displaced laterally in the aperture 14 as a function of the relative thermal movements between the wall 13 and the printed circuit 3. However, the lateral play is limited to ensure as accurate a positioning as possible of the circuit 3 relative to the wall 13 in spite of this freedom of movement. The longitudinal and lateral plays also have the advantage of easing the production tolerances.

Between the four corners 22, each aperture 14 extends beyond the rectangle defined by them. For this purpose, the apertures 14 possess over their length cut-outs which are intended to mitigate further the problems of precision during production. Over their width, the apertures 14 have cut-outs with a U-shaped profile 23, which expose at each end of each aperture 14 a perforation 24 located in the shoulder 17 (FIGS. 2 to 4).

Each slide 11 possesses a foot 26 having three wings 27, 28, 29, of which the faces directed towards the wall 13 form a plane bearing on the latter. The wing 29 which, during operation, is directed towards the associated block 8 carries on its lower face a stud 31 which, during operation, is engaged substantially without play into the perforation 24 in order to create, between each slide foot 26 and the adjacent block 8, a mechanical connection allowing the block 8 to drive the side foot 26 especially for displacement parallel to the wall 13 and transverse to the rows of connections. The wing 28 directed perpendicularly to the rows of connections carries on its lower face a tenon 32 flattened in this direction and engaged in a slit 33 performing the function of a mortise, which passes through the wall 13 and which has a length suitable for leaving a play at each end of the tenon 32 (FIG. 7).

The slides 11 are thus free to move relative to the printed circuit 3 or the wall 13 in in a direction away from the wall 13 and transversely to the latter.

The container 1 has two opposing flanks 34 (see FIG. 1) fastened, parallel to the housings 4, by means of screws 35 to lugs 30 themselves fastened to the ends of the U-shaped edges of the inner wall 13 (FIG. 5).

Figure 7:
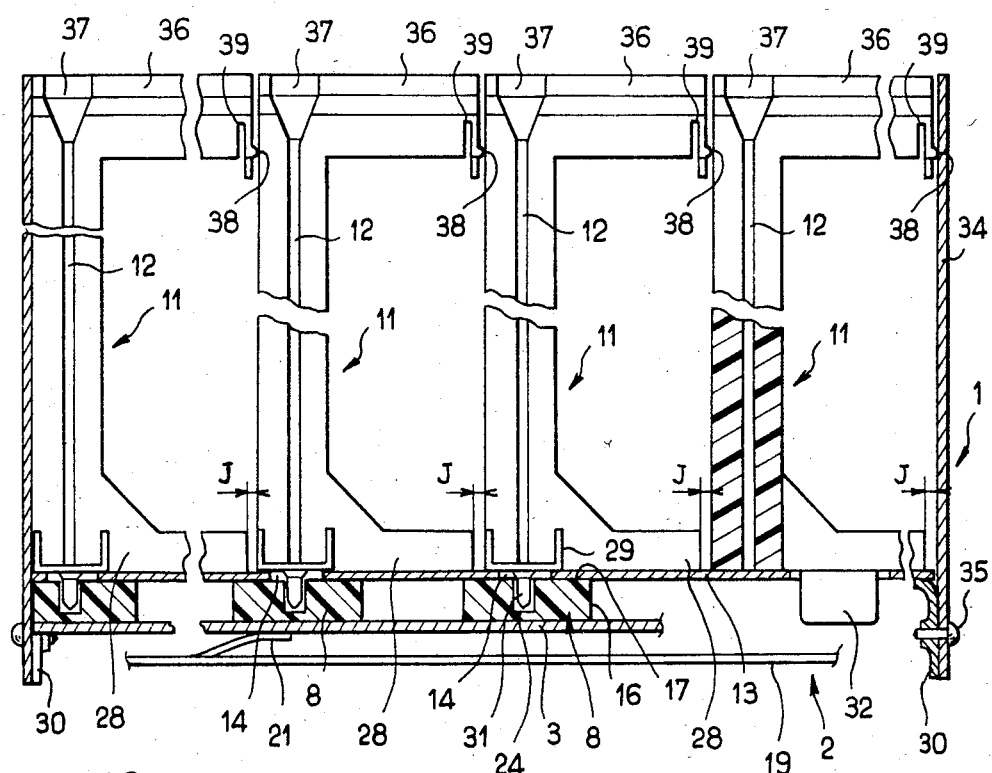
FIG. 7 is a partial view of the container carrying the slides in a section along a plane such as VII—VII in FIG. 3.

As shown in FIG. 7, the distance between the flanks 34 makes it possible to accommodate a certain number of slides 11 there, each time leaving a certain play J (for example, 0.5 mm) between the end of the wing 28 of a slide 11 and the adjacent slide 11.

At their end remote from the inner wall 13, the slides 11 have a widened head 36, in which the slot 12 opens out into a funnel 37 intended to make it easier to introduce the cards 6. The fact that the studs 31 are in their perforations 24 guarantees that the slots 12 of the two slides 11 facing one another and the orifice 9 in the connecting block 8 located between them are in one and the same plane, with the result that the cards 6 are not damaged in any way when they are introduced.

The dimension of the widened heads 36 in the direction perpendicular to the plane 34 is such that the heads 36 are positioned rigidly between the flanks 34. To simplify the problems of precision during manufacture, the end of each head 36 bears against the adjacent slide 11 or against the flank 34 respectively by means of a boss 38, behind which is made a notch 39 allowing the boss 38 a certain degree of elastic movement in the direction perpendicular to the flanks 34, that is to say the direction parallel to the bottom 2 of the container 1 and transverse to the rows of connections.

The method of assembling a container according to the invention will now be described with reference to FIGS. 9 to 11: a U-shaped framework is first constructed by the two flanks 34 being fastened by means of the screws 35 to the inner wall 13 having its apertures 14. As shown in FIG. 10, the printed circuit 3 is subsequently installed under the wall 13, its connecting blocks 8 thus appearing through the apertures 14, and the screening cover 19 is fitted.

The bottom 2 of the container, constructed in this way, is placed horizontally, and the slides 11 forming the other two (lattice) walls of the container 1 are installed one by one.

As shown in FIGS. 1 and 4, a pair of crossmembers 41, 42 is subsequently mounted against and on the outside of each lattice wall formed by the slides 11. Each crossmember 41, 42 extends from one of the flanks 34 to the other and is fastened to these. The crossmember 41 is placed against the wing 27 of the feet 26 which which points away from the connecting blocks 8. The crossmember 41 is located on wings 27 on the side thereof facing away from the wall 13, and thus constitutes an element which prevents the slides 11 from moving perpendicularly to the wall 13. Furthermore, the crossmember 41 compels the foot 26 to remain pressed flat against the wall 13 and therefore prevents the slides 11 from tilting. However, the free distance between the crossmember 41 and the wall 13 is sufficient to allow the displacement of the slide 11 parallel to the crossmember 41, when the slide 11 is carried along in this direction by the printed circuit 3.

The other crossmember 42 is mounted against the heads 36 of the slides 11 and is engaged behind a lip 43 which each head 36 possesses in the direction of the wall 13. The crossmembers 42 make the positioning effected by the crossmembers 41 more rigid by preventing the displacement of the heads 36 parallel to the rows of connections 8 in both directions.

The housings 4 can then be installed between the slides 11, as shown in FIG. 1.

Figure 8:
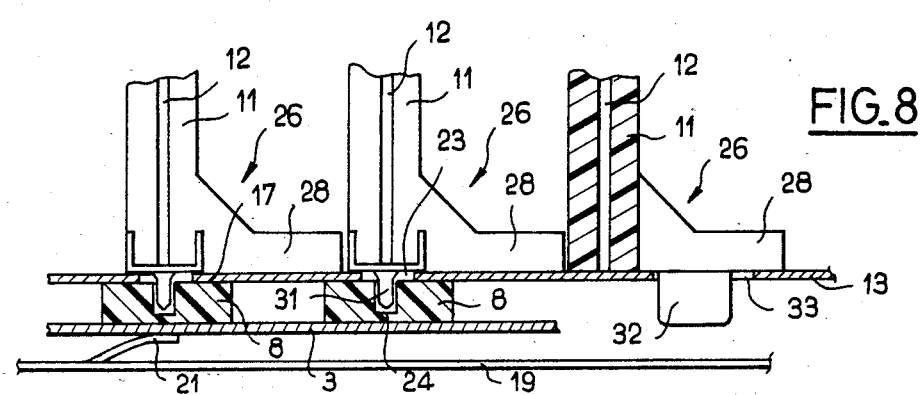
FIG. 8 is a view similar to part of FIG. 7, showing the displacement of the feet of the slides in an example of movement of thermal origin.

As shown in FIG. 8 in comparison with FIG. 7, when the printed circuit 3 experiences a greater thermal contraction than the inner wall 13, the left-hand connecting block 8 being assumed to remain immobile, the connecting blocks 8 of the other two slides 11 illustrated tend to reduce the interval between them and approach the one on the left. Because of the coupling means comprising the perforations 24 and the studs 31, the displacement of the blocks 8 entails the displacement of the feet 26 of the corresponding slides 11, with the result of a reduction in the play between the feet 26. During its displacement, the printed circuit 3 can slide on the tabs 21 of the cover 19, whilst the shoulder 17 of the blocks 8 slides under the inner wall 13. The displacement of the feet 26 of the slides 11, caused in this way, is permitted by the flattened tenons 32 which slide in the slits 33.

The invention thus allows the printed circuit 3 to experience without constraint the movements of thermal or other origin to which it may be subject, even if these movements differ from those of the metal parts, this being ensured, however, without the slides being fastened to the printed circuit and without the risk that the slot 12 of the slides 11 will leave their coplanar relationship with the orifice 9 of the connecting blocks 8.

Figure 9:
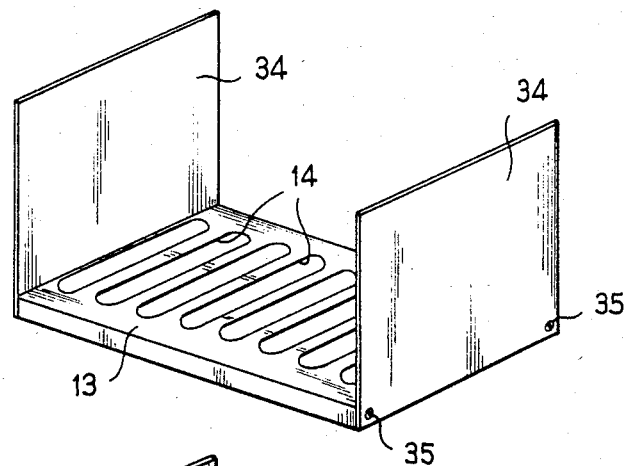
FIG. 9 is a perspective view of the inner wall to which the two flanks are fastened.
Figure 10:
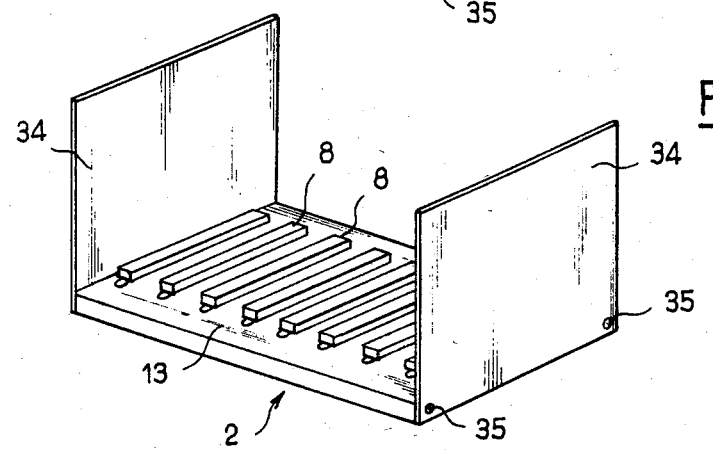
FIG. 10 is a view similar to FIG. 9, after the printed circuit has been installed.
Figure 11:
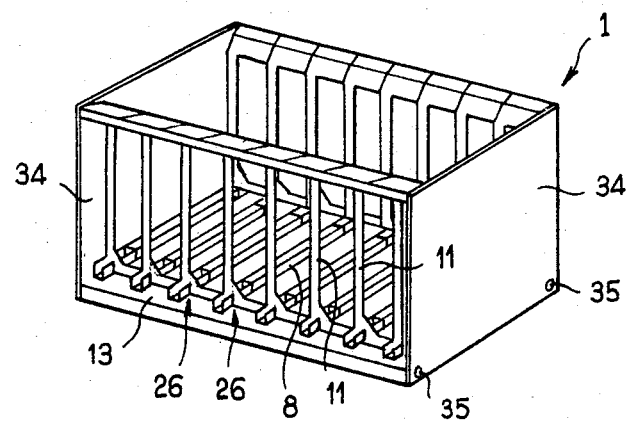
FIG. 11 is a view similar to that of FIG. 10, after the slides have been installed.

In the example illustrated in FIG. 12, the starting-point is a U-shaped framework which is similar to that of FIG. 9, except that the bottom 52 of the container 1 consists of two modular elements 2, each of which is identical to the bottom 2 of FIGS. 1 to 11, and that the flanks 34 have in relation to those of FIGS. 1 to 11 a double dimension measured parallel to the rows of connections. The flanks 34 are fastened to the two modular elements 2 by means of four screws 35 screwed into the lugs 30 of the two elements 2 and thus ensure that the elements 2 are fastened to one another, being joined by means of one of their edges perpendicular to the rows of connections.

As shown in FIG. 17, the double container can receive, between the slides 11 forming the side walls, housings 54 the height of which corresponds to the spacing between the said slides 11. Such housings carry an input/output card, the width of which allows it to slide in two opposing slides 11 and to interact with two aligned blocks 8. However, the container can receive housings 4 similar to those of FIGS. 1 to 11 and intended to interact only with one of the elements 2 of the bottom. In this case, it is possible to mount two housings 4 in the same plane in the space which a single housing 54 could have occupied.

For this purpose, the invention envisages mounting a double slide 56 on the joined edges of the two elements 2 so as to straddle them, this double slide having a slot 12 opening towards each of the two housings 4 which are in the same plane and which it separates.

As shown in FIGS. 13 to 16, a double slide 56 comprises two elementary slides 57 joined together into a single block of molded synthetic material by means of webs 58. Each of the elementary slides 57 is similar to a slide 11 of FIGS. 1 to 11, and in particular each slide 57 has a foot 59 comprising a wing 29, carrying a stud 31 intended for interacting with a perforation 24 in a connecting block 8, and a wing 28 carrying a tenon 32 intended to be accommodated in a mortise 33 in one of the bottom elements 2. Thus, each double slide 56 interacts with a perforation 24 and with a slit 33 in each of the elements 2 which it straddles, by means of a double foot formed by two feet 59.

As shown in FIGS. 15 and 16, the foot of each elementary slide 57 also possesses a lobe 61 located in the angle between the wings 28 and 29 of the foot 59. The lobe 61 is made in tubular form for reasons of rigidity. It has a web 62 which, during operation, is against the inner wall 13 of the adjacent element 2 and which possesses a laterally open perforation 63 making it possible to fasten the double slide 56 by means of screwing to each of the bottom elements 2 which has, for this purpose, a tapped perforation 64 in the vicinity of each longitudinal end of each aperture 14 (FIG. 3). The lobe 61 also incoporates a web 66 which is parallel to the web 62 and which has an indentation 67 to receive a screw (not shown). The perforation 63 has a diameter greater than that of the screw used for fastening, if it is desired that the double slide 56 should be capable of following the movements of thermal or other origin of the printed circuits 3 relative to the inner walls 13, in the same way as the lateral slides 11. The perforations 63 can also be elongated parallel to the tenons 32.

As shown in FIGS. 14 and 16, the free end of the widened head 36 of each elementary slide 57 is connected to the free end of the foot 59 by means of a reinforcing column 68 connected to the webs 58.

Thanks to the double slides 56 according to the invention, it is possible, as shown in FIG. 17, to arrange alternately a double housing 54 and two housings of elementary dimension 4 in an organization governed by the circuit contingencies, without the need to group the housings 4 on one side and the housings 54 on the other side.

In the exemplary embodiment illustrated in FIGS. 18 and 19, of which only the differences relative to the embodiment of FIGS. 1 to 11 will be described, the crossmembers 41 and 42 have identical profiles, but are mounted symmetrically relative to one another.

Each crossmember 41 or 42 has a body with a C-shaped profile, the plane web 71 of which is pressed against the slide 11. The body with a C-shaped profile also possesses two parallel wings 72, the two ends of which form two ribs 73 directed towards one another. Connected to one of the edges of the web 71 is an oblique wing 74 which is located on the outside of the C and which forms an angle of approximately 45° with the adjacent wing 72. Remote from the web 71, the oblique wing 74 is bent at 135° and thus has one end parallel to the wings 72.

The oblique wing 74, bent at 135°, of each crossmember member 42 is in contact with rests having the same profile, these rests being provided on the head 36 of thes slides 11 on the outside of the container 1. The end of the oblique wing 74 is engaged behind the lip 43.

The end, bent at 135°, of each crossmember 41 is laid against the wing 27 of the feet 26 of the slides 11.

FIG. 18 shows a terminal-box 76, a bottom 77 of which is fitted into the housing 4. A bundle of wires 78 extends from one of the ends of the terminal-box 76 for junction with the devices to be monitored or to be controlled, with power sources or the like.

The wires 78 are brought towards the bottom 2 of the container 1, and for this purpose they are engaged in a wire guide 79 having the form of a gutter with two side walls 81 connected opposite the container 1 by means of a bottom 82. A terminal-box 76 and a wire guide 79 are provided for each housing 4. The bottom 82 carries three elastic lugs 83 which end in noses 84 intended to snap onto the ribs 73 of the crossmember 42 and onto the crossmeber 41 and more particularly onto the rib 73 thereof which is nearer to the crossmember 42. At least two of the lugs 83 possess on this side of the nose 84 a notch 86 intended for receiving the corresponding rib 73 and preventing the movements of the wire guide in the two directions transverse to the plane of the rib 73.

At the two ends of the wire guide 79, each side wall 81 carries extensions 80 pointed in the opposite direction to the bottom 82 and carrying at their free end lugs 87 directed towards one another. The free edges 88 of the lugs 87 are substantially parallel to one another, but oblique relative to the longitudinal center plane of the wire guide. They are also separated by a distance which is at least equal to the diameter of one wire of the bundle 78. To insert the wires of the bundle 78 into the wire guide 79, they are bent so that they are made to pass between the edges 88 of the lugs 87. Once the wires have been connected at their two ends, the obliqueness of the passage between the edges 88 is sufficient to prevent them from escaping from the wire guide 79.

Of course, the invention is not limited to the examples described and illustrated, and many modifications can be made to these examples, without departing from the scope of the invention.

Thus, the lateral slides 11 could be associated directly with the inner wall 13, so as to slide relative to the latter in the direction perpendicular to the rows of connections, and this could make the crossmember 41 superfluous.

It is also possible for the circuit 3 to be fastened to the wall 13 at a point or along a line, in order to give the circuit 3 a fixed initial positioning relative to the wall 13. This would not prevent the circuit 3 from experiencing movements of thermal origin relative to the wall 13 at a distance from this fastening.

We claim:

1. A card receptacle for removably receiving input-output cards and making connections between them and a printed circuit board, said card receptacle comprising:

a container (1) carrying in a bottom region thereof the printed circuit board (3), the latter being subject to thermal expansion and contraction and guided for displacement in its own plane with respect to the container (1) due to such expansion and contraction, the printed circuit board carrying towards the interior of the container connectors (8) each providing a row of electrical connections;

slides (11) aligned side by side in two rows extending transverse to the rows of electrical connections, said slides being adapted to removably receive and guide two opposed edges of input-output cards (6) having on a third of their edges pins (7) insertable into the connectors (8); and retaining means (26, 32, 33, 41) for retaining one foot of each slide (11) against displacement parallel to the rows of connections and displacement transverse to the printed circuit board (3);

the adjacent feet of the slides having play between them and being mounted so as to be laterally displaceable with respect to one another.

2. A card receptacle as claimed in claim 1, wherein, remote from the printed circuit board (3), the slides (11) are positioned substantially rigidly relative to the container (1) in the direction parallel to the printed circuit board (3), and transverse to the rows of connections.

3. A card receptacle as claimed in claim 2, wherein the slides (11) have, remote from the printed circuit board (3), heads (36) of such dimensions as to be substantially in abutment against one another between bearing means (34) stationary with respect to the container (1), when all the slides are installed in the container (1).

4. A card receptacle as claimed in claim 3, wherein each slide (11) carries, in the vicinity of its head (36), an element (38) which, during operation, resiliently bears laterally against one adjacent slide (11).

5. A card receptacle as claimed in claim 1, wherein the bottom region (2, 52) of the container (1) has, in the longitudinal direction of the rows of connections, a suitable dimension for receiving either input/output cards substantially occupying this dimension or alternatively input/output cards (6) which can be arranged end to end in this direction in numbers of at least two, and wherein the slides comprise lateral slides (11) adjacent to side regions of the container, and double slides (56), wherein each double slide is adapted to be mounted between two input/output cards (6) disposed end to end, the double slides (56) having two elementary slides (57) arranged back to back.

6. A card receptacle as claimed in claim 5, wherein the container (1) comprises in its bottom region at least two modular elements (2) joined together along an edge transverse to the rows of connections, each modular element (2) carrying a printer circuit board (3) and, along each of its edges transverse to the rows of connections, positioning means (33) for the lateral slides (11), and wherein the double slides (56) posses a double foot (59) adapted to straddle the joined edges of two adjacent modular elements (2) and arranged so as to interact with at least a part of the positioning means (33) which part is carried by the modular elements (2) adjacent said two edges.

7. A card receptacle as claimed in claim 6, wherein each modular element carries, in the vicinity of each of its edges, means (64) intended for interacting with a foot (59) of a double slide (56), so as to immobilize the latter in respect of movements perpendicular to the printed circuit boards (3), and wherein the double foot (59) of each double slide (56) is designed to interact in this way with each of the joined edges of the modular elements (2) which it straddles.

8. A card receptacle according to claim 1 and comprising means for mechanically coupling the feet of at least some of the slides with the printed circuit board (3) for common displacement of said feet with the adjacent connectors (8) in a direction parallel to the circuit board and tranverse to the rows of connections.

9. A card receptacle as claimed in claim 1, wherein the slides (11) are uncoupled from the printed circuit board (3) in a direction transverse to the printed circuit board (3).

10. A card receptacle as claimed in claim 1 having means for applying the printed circuit board (3) via bearings stops (17) against an inner wall (13) of the container, said inner wall being interposed between the printed circuit board (3) and the interior of the container (1) and having apertures (14) giving access to the connectors (8) from the interior of the container.

11. A card receptacle as claimed in claim 10, comprising a screening cover (19) which covers the printed circuit board (3) on a side thereof facing away from the interior of the container, wherein the screening cover (19) carries the means (21) for applying the printed circuit board (3) against the inner wall (13) via the bearing stops (17).

12. A card receptacle as claimed in claim 11, wherein the means for applying the printed circuit board (3) against the inner wall (13) via the bearing stops (17) comprise slashes made in the screening cover (19) and which form elastic tabs (21) towards the inner wall (13).

13. A card receptacle as claimed in claim 10, wherein the stops means (17) are carried by the connectors (8).

14. A card receptacle as claimed in claim 13, wherein the connectors (8) are engaged in the apertures (14) with a certain play in the direction transverse to the rows of connections, and wherein at least some of the connectors (8) possess a base (16) which forms, on a side thereof facing away from the printed circuit board (3), a shoulder (17) belonging to the above-mentioned bearing stops and interacting with the inner wall (13) in the vicinity of the periphery of the apertures (14).

15. A card receptacle as claimed in claim 5, wherein the apertures have edges (22) interacting with the connectors (8) to ensure that the printed circuit (3) is positioned with a certain play in directions parallel to the printed circuit board.

16. A card receptacle as claimed in claim 14, wherein the shoulder (17) of each connector (8) carries means for mechanical coupling with the feet of said slides cooperating with this connector (8) for common displacement of said feet and connector in a direction parallel to the circuit board and transverse to the rows of connections, sand wherein each aperture (14) possesses adjacent the ends of the corresponding connector (8) cut-outs (23) allowing said mechanical coupling.

17. A card receptacle as claimed in claim 10, comprising between each foot (26) of a said slide (11) and the inner wall (13) of the container (1), a means fo guidance by tenon (32) and mortise (33) allowing displacement of each foot transverse to the rows of connections with respect to the inner wall (13).

18. A method of assembling a card receptacle adapted to removably receive input-output cards and to make electrical connections between them and a printed circuit board, said method comprising the steps of providing a U-shaped framework comprising a bottom wall (13) and two flanks (34) extending orthogonally from two opposite edges of the bottom wall, mounting a printed circuit board (3) for displacement in its own plane adjacent an outer face of the bottom wall, installing slides (11) in substantially stable abutting relation against an inner face of the bottom wall (13) so as to form with said slides two opposite walls of the container, each extending between the two flanks (34), fastening to the two flanks at least one crossmember (41) outside each of the walls formed by the slides, so as to retain the slides against displacement transverse to the bottom wall (13) and to allow displacement of the slides parallel to said at least one crossmember, slidably inserting each input/output card (6) between two slides (11, 56) facing each other, and plugging each card into at least one respective connector (8) carried by the printed circuit board.

19. A method according to claim 18, comprising the step of fastening wire guides (79) to at least some of the crossmembers, and inserting in said wire guides bundles of wires (78) issuing from terminal-boxes (76) connected to the boards remote from the bottom of the container.

20. A method according to claim 19, wherein during insertion of the bundles of wires in the wire guides, each said bundle of wires is passed between two tongues (87) which partially close the corresponding wire guide and have free edges (88) which are substantially parallel to one another and oblique relative to the longitudinal center plane of the wire guide.

* * * * *